United States Patent
Ryu et al.

(10) Patent No.: US 9,612,302 B2
(45) Date of Patent: Apr. 4, 2017

(54) MAGNETIC RESONANCE IMAGING APPARATUS WITH RF COIL ELEMENTS HAVING CROSSING CONDUCTIVE LAYERS

(71) Applicant: Samsung Electronics Co., Ltd., Suwon-si (KR)

(72) Inventors: Yeun-chul Ryu, Hwaseong-si (KR); Jae-mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 638 days.

(21) Appl. No.: 14/108,894

(22) Filed: Dec. 17, 2013

(65) Prior Publication Data
US 2014/0239952 A1    Aug. 28, 2014

(30) Foreign Application Priority Data
Feb. 27, 2013    (KR) .................. 10-2013-0021388

(51) Int. Cl.
*G01R 33/34* (2006.01)
*G01R 33/3415* (2006.01)

(52) U.S. Cl.
CPC ... *G01R 33/34007* (2013.01); *G01R 33/3415* (2013.01)

(58) Field of Classification Search
CPC .................. G01R 33/34007; G01R 33/3415
See application file for complete search history.

(56) References Cited

U.S. PATENT DOCUMENTS

| | | | |
|---|---|---|---|
| 5,548,218 A * | 8/1996 | Lu ................ | G01R 33/34 324/318 |
| 6,900,636 B2 | 5/2005 | Leussler | |
| 7,710,117 B2 | 5/2010 | Vaughan et al. | |
| 2005/0231201 A1 | 10/2005 | Fujimoto et al. | |
| 2012/0286786 A1 * | 11/2012 | Schellekens ....... | G01R 33/3415 324/322 |

FOREIGN PATENT DOCUMENTS

KR    10-1113547    2/2012

* cited by examiner

*Primary Examiner* — G. M. Hyder
(74) *Attorney, Agent, or Firm* — NSIP Law

(57) ABSTRACT

Provided is a magnetic resonance imaging (MRI) apparatus. The MRI apparatus includes a magnet configured to generate a magnetic field; a magnetic field coil configured to generate a gradient magnetic field and the magnetic field coil is disposed inside the magnet; and a radio-frequency (RF) coil unit comprising RF coil elements and the RF coil unit is disposed inside the magnetic field coil.

12 Claims, 5 Drawing Sheets

MAGNETIC RESONANCE IMAGING APPARATUS WITH RF COIL ELEMENTS HAVING CROSSING CONDUCTIVE LAYERS

CROSS-REFERENCE TO RELATED APPLICATION

This application claims the benefit under 35 U.S.C. §119(a) of Korean Patent Application No. 10-2013-0021388, filed on Feb. 27, 2013 in the Korean Intellectual Property Office, the disclosure of which is incorporated herein by reference for all purposes.

BACKGROUND

1. Field

The following description relates to a magnetic resonance imaging system.

2. Description of the Related Art

There are various diagnostic devices used for diagnosing problems inside a human body to cure or prevent diseases. A magnetic resonance imaging (MRI) device is one of widespread diagnostic devices, which uses a magnetic field produced by magnetic force. The MRI system includes elements for applying a radio frequency signal to body tissues in order to induce resonance, and for applying gradient signals to the body tissues in order to achieve spatial information about the body tissues. By using the MRI system, it is possible to obtain structural imaging of inner body parts and tissue, and to detect normal and abnormal cells or tissues.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a magnetic resonance imaging (MRI) apparatus includes a magnet configured to generate a magnetic field; a magnetic field coil configured to generate a gradient magnetic field and the magnetic field coil is disposed inside the magnet; and a radio-frequency (RF) coil unit comprising RF coil elements and the RF coil unit is disposed inside the magnetic field coil.

The RF coil unit may include an insulating structure; and the RF coil elements are disposed on the insulating structure.

The RF coil elements may include a first conductive layer placed in a first direction; a first dielectric layer mounted on the first conductive layer; and a second conductive layer mounted on the first dielectric layer and placed in a second direction.

A second dielectric layer may be disposed between the insulating structure and the first conductive layer.

A width of the first conductive layer where the first and second conductive layers cross each other may be narrower than other portions of the first conductive layer.

A width of the second conductive layer where the first and second conductive layers cross each other may be narrower than other portions of the second conductive layer.

The insulating structure may be composed of fiber reinforced plastics (FRP).

In another general aspect, a magnetic resonance imaging (MRI) apparatus includes a surface type radio frequency (RF) coil unit that is located inside a bore of the MRI system; and the surface type RF coil unit comprising RF coil elements.

The surface type RF coil unit may include an insulating structure; and the RF coil elements are disposed on the insulating structure.

The RF coil element may include a first conductive layer placed in a first direction; a first dielectric layer mounted on the first conductive layer; and a second conductive layer mounted on the first dielectric layer and placed in a second direction.

A second dielectric layer may be disposed between the insulating structure and the first conductive layer.

A width of the first conductive layer where the first and second conductive layers cross each other may be narrower than other portions of the first conductive layer.

A width of the second conductive layer where the first and second conductive layers cross each other may be narrower than other portions of the second conductive layer.

The surface type RF coil unit may be mounted on a bed.

In another general aspect, a RF coil unit of a magnetic resonance imaging (MRI) apparatus including an insulating structure; and RF coil elements disposed on the insulating structure.

The RF coil element may include: a first conductive layer placed in a first direction; a first dielectric layer mounted on the first conductive layer; and a second conductive layer mounted on the first dielectric layer and placed in a second direction.

A second dielectric layer may be disposed between the insulating structure and the first conductive layer.

A width of the first conductive layer where the first and second conductive layers cross each other may be narrower than other portions of the first conductive layer; and a width of the second conductive layer where the first and second conductive layers cross each other may be narrower than other portions of the second conductive layer.

A controller may be connected to each conductive layer of the RF coil elements.

The controller may be connected to the conductive layers of the RF coil elements using cables, and the cables may be configured to transmit signals between the RF coil elements and the controller.

Other features and aspects will be apparent from the following detailed description, the drawings, and the claims.

Figure 1:
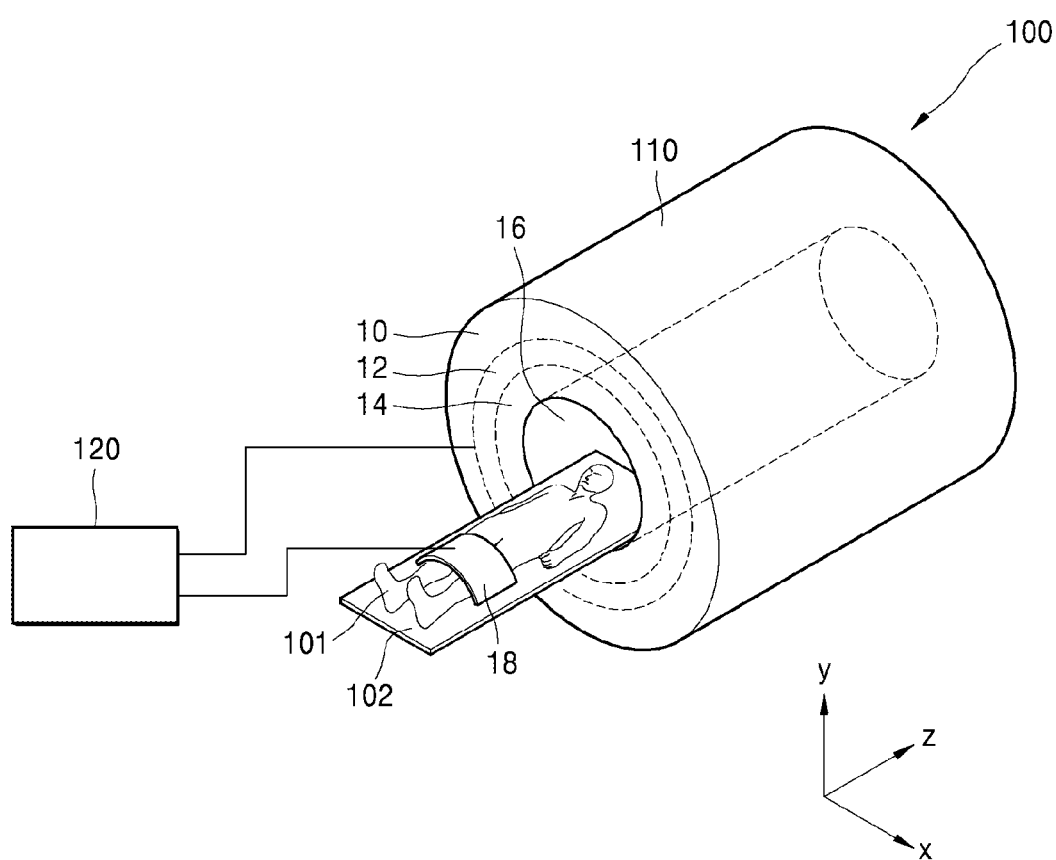
FIG. 1 is a diagram illustrating an example of a magnetic resonance imaging (MRI) system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be apparent to one of ordinary skill in the art. Also, descriptions of well-known functions and constructions may be omitted for increased clarity and conciseness.

FIG. 1 diagram illustrating an example of the MRI system. Referring to FIG. 1, the MRI system 100 may include an MRI scanning device 110 and a data process device 120 that is connected to the MRI scanning device 110. The MRI scanning device 110 may include a main magnet 10, a gradient magnetic field coil 12 that is formed inside the main magnet 10, and a radio frequency (RF) coil unit 14 that is formed inside the gradient magnetic field coil 12. A bed 102 slides the examinee 101 into a bore 16. The examinee 101 is placed at a predetermined position on the bed 102. In addition, a radio frequency shield may be provided between the gradient magnetic field coil 12 and the RF coil unit 14 so that the shield blocks the radio frequency generated from the RF coil unit 14.

The MRI system 100 makes it possible to obtain images that contain information about the examinee's body parts and tissues without incision into the body. The examinee 101 is positioned on the bed 102 and enters the bore in a z-axis direction. A diagnostic imaging is created by the MRI scanning system 110 when the examinee 101 is placed on the bed 102 and slid inside the bore 16. The bed 102 may slide into the bore 16 and multiple images may be created.

In order to create the diagnostic imaging of a predetermined area of the examinee 101, the MRI scanning system 110 may use a magnetic field generated by a magnetic force. The predetermined parts of the examinee to be examined may include, but is not limited to, the body, the brain, the vertebra, the heart, the liver, the skeleton, the chest, the lungs, the abdomen, the pelvis, the wrists, the hands, the ankles, the knees, the feet, and the fetus. The MRI system 100 may be a hybrid MRI system that is combined with other medical imaging devices such as, for example, a positron emission tomography system that uses a radioisotope emitting a positron.

The main magnet 10 may provide a static magnetic field and may be formed in a cylinder shape. The gradient magnetic field coil 12 may provide a gradient magnetic field that has a predetermined gradient in a nuclei spin direction when the main magnet 10 has applied the static magnetic field. While the main magnet 10 creates a static magnetic field around the examinee 101, the gradient magnetic field coil 12 creates a variable field, which allows different parts of the body to be scanned.

While the static magnetic field and the gradient magnetic field is applied to a predetermined area of the examinee 101, a radio frequency (RF) coil unit 14 applies a radio frequency magnetic field by sending a radio frequency pulse to the examinee 101. The RF coil unit 14 can receive and transmit a magnetic resonance signal generated from the examinee 101. A diameter of the bore 16 that is formed inside the MRI scanning system 110 may be selectively decided depending on an inner diameters of the main magnet 10, the gradient magnetic field coil 12, the RF coil unit 14, the size of the bed 102, and the desired opening of the bore 16.

Figure 2:
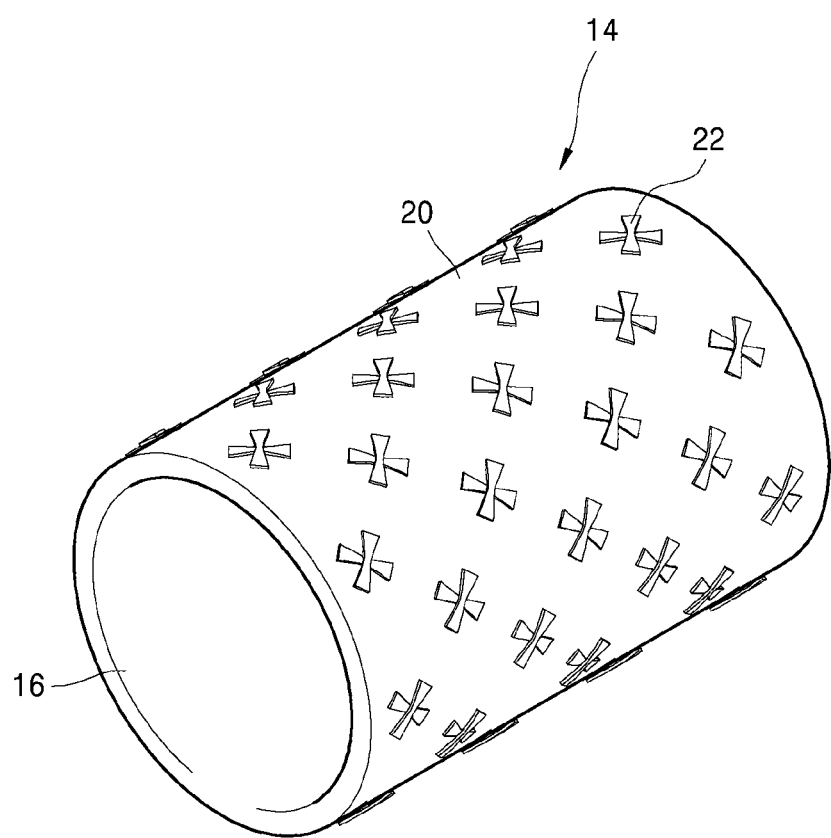
FIG. 2 is a diagram illustrating an example of a radio frequency (RF) coil unit of the MRI system.

FIG. 2 is a diagram illustrating an example of the RF coil unit 14 of the MRI system. The RF coil unit 14 of the MRI system may include a RF coil element that includes conductive layers crossing each other.

Referring to FIG. 2, the RF coil unit 14 may have multiple RF coil elements 22 disposed on an insulating structure 20. The insulating structure 20 can be formed of materials that are light in weight and have good corrosion resistance and formability, such as, for example fiber reinforced plastics (FRP). The RF coil elements 22 may comprise two conductive layers, where one element is superimposed over the other. One or more RF coil elements 22 may be disposed on the insulating structure 20. Distance between the RF coil elements 22 may be adjusted as necessary, and the RF coil elements 22 may be distributed at an equal interval or the RF coil elements 22 may be irregularly distributed.

Figure 3A:
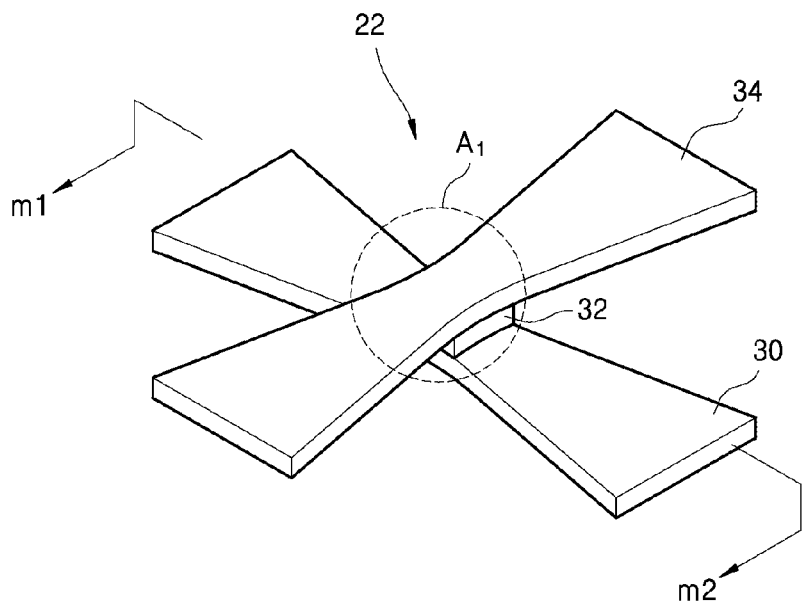
FIG. 3A is a diagram illustrating an example of a radio frequency (RF) coil element of the RF coil unit of the MRI system.
Figure 3B:
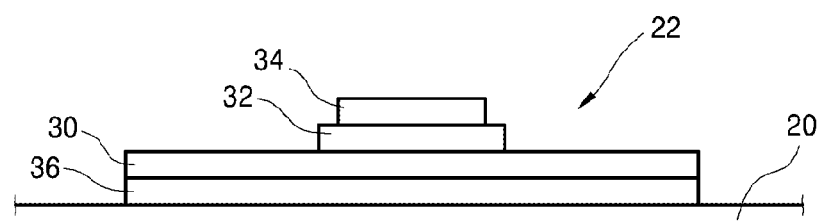
FIG. 3B is a diagram illustrating a cross-sectional view that is taken along line m1-m2 of FIG. 3A.

FIG. 3A is a diagram illustrating an example of the RF coil element 22. FIG. 3B is a diagram illustrating a cross-sectional view that is taken along line m1-m2 of FIG. 3A. Referring to FIGS. 3A and 3B, the RF coil element 22 may include a first conductive layer 30 formed in a first direction and a second conductive layer 34 formed in a second direction different from the first direction. The first conductive layer 30 is superimposed over the second conductive layer 34 and a first dielectric layer 32 may be disposed between the first and second conductive layers 30 and 34. As shown in FIG. 3B, the RF coil element 22 may also include a second dielectric layer 36 that is disposed between the insulating structure 20 and the first conductive layer 30. The first and second conductive layers 30 and 34 may be formed of any conductive materials, such as, for example, a metal or an alloy that can be used as the RF coil. The first and second conductive layers 30 and 34 may be formed of a single or multiple layers of metal conductive materials. The first and second dielectric layers 32 and 36 may be made of a dielectric material such as, for example, silicon oxide, silicon nitride, hafnium oxide, or aluminum oxide.

As shown in FIG. 3A, the first and second conductive layers 30 and 34 are superimposed such that they cross each other at cross area A1. The width of the first and second conductive layers 30 and 34 in the cross area A1 may be narrower than the width of other portions of the first and second conductive layers 30 and 34. This reduces the interference between the magnetic fields of the first and second conductive layers 30 and 34. The first and second conductive layers 30 and 34 may be selectively shaped such that their widths taper from the end portions to the area where they cross each other. The widths may taper as desired linearly, progressively, or less than linearly. A $B1^+$ field uniformity is enhanced by having the first and second conductive layers 30 and 34 cross each other in the z-aixs direction, thus increasing a valid field size in the z direction and enhancing field efficiency.

Each RF coil element 22 that is formed on the RF coil unit 14 may be independently controlled. The first and second conductive layers 30 and 34 of the RF coil element 22 may be configured to be managed as independent channels and may be advantageous for multi-band imaging because of using a multi-channel transit.

FIG. 3A illustrates an example where the widths of the first and second conductive layers 30 and 34 are gradually and linearly decreased from the ends to the cross area A1, but the shape of the first and second conductive layers 30 and 34 may be modified in various forms. For example, the widths may selectively taper linearly, progressively, or less than linearly.

Figure 4A:
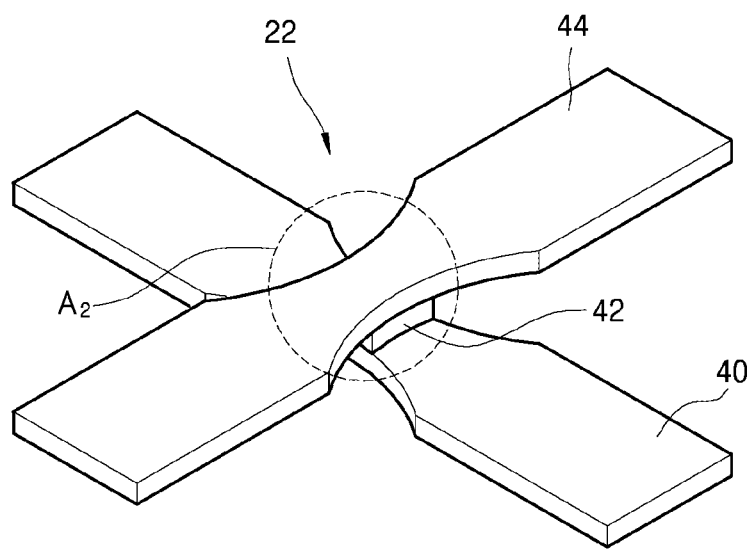
FIGS. 4A and 4B are diagrams illustrating examples of various forms of the RF coil element of the RF coil unit of the MRI system.
Figure 4B:
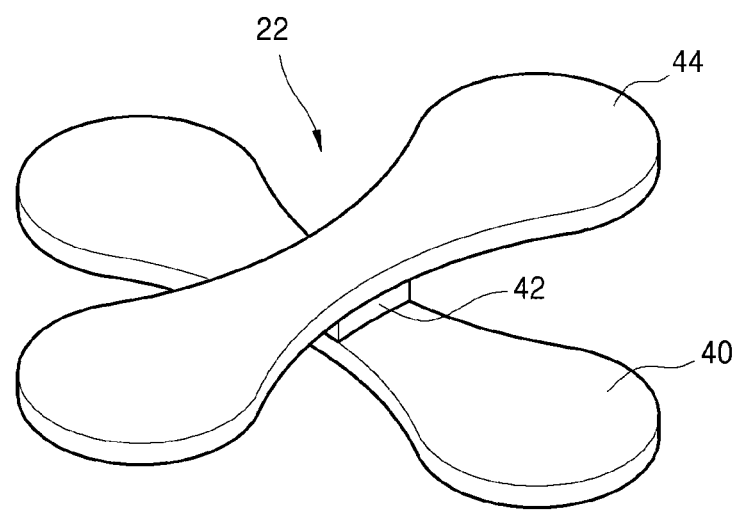

FIGS. 4A and 4B are diagrams illustrating other examples of the RF coil element 22 of the RF coil unit of the MRI system. FIGS. 4A and 4B disclose RF coil elements 22 including a first conductive layer 40, a second conductive layer 44, and a dielectric layer 42 formed between the first and second conductive layers 40 and 44. In FIG. 4A, the first and second conductive layers 40 and 44 have a uniform width except for a cross area A2. In the cross area A2, the widths of the first and second conductive layers 40 and 44 decrease suddenly. In FIG. 4B, the first and second conductive layers 40 and 44 of the RF coil element 22 are shaped as dumbbells, and the width of the first and second conductive layers 40 and 44 varies along the length of the dumbell, with the width being the narrowest at the cross area. The examples shown in FIGS. 3A-4B are only non-exhaustive illustrations of the RF coil element 22, and other shapes and configuration of the RF coil element 22 are considered to be well within the scope of the present disclosure.

The RF coil unit 14 in the example of FIG. 2 is in form of a cylinder, but various other shapes of the RF coil unit 14 are considered to be well within the scope of the present disclosure. For example, as shown in FIG. 1, the RF coil unit may be applied as a surface type radio frequency (RF) coil unit 18 that is located around a certain area of the examinee 101.

Figure 5:
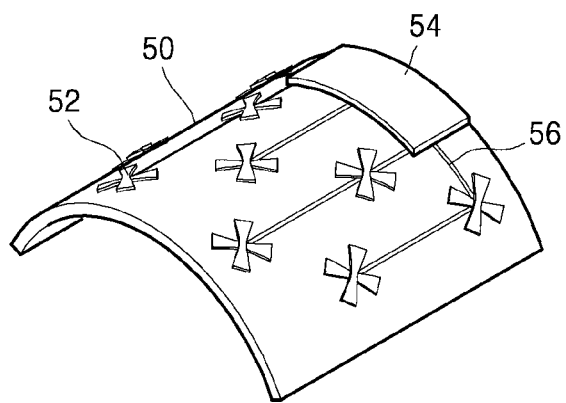
FIG. 5 is a diagram illustrating another example of the RF coil unit of the MRI.

FIG. 5 is a diagram illustrating an example of the surface type RF coil unit of the MRI system. Referring to FIG. 5, the surface type RF coil unit may include radio frequency (RF) coil elements 52 that are disposed on an insulating structure 50. The insulating structure 50 for the example shown in FIG. 5 is curved in shape, but various other shapes of the insulating structure 50, such as for example, flat, are considered to be well within the scope of the present disclosure. A controller 54 that is connected to each conductive layer of the RF coil elements 52 through cables 56 may be selectively disposed on the insulating structure 50. Cables 56 may be configured to transmit signals between the RF coil elements 52 and the controller 54. The structure and components the RF coil element 22 is described with reference to FIGS. 3A-4B. The description of the RF coil elements 22 is also applicable to the RF coil elements 52 shown in FIG. 5, and thus, will not be repeated here.

The RF coil unit shown in FIG. 5 may be placed in many different positions. For example, the RF coil unit may be placed in the bore 16 inside the RF coil unit 14 of the MRI scanning system 110 of FIG. 1, or it may be provided on the bed of FIG. 1.

Figure 6:
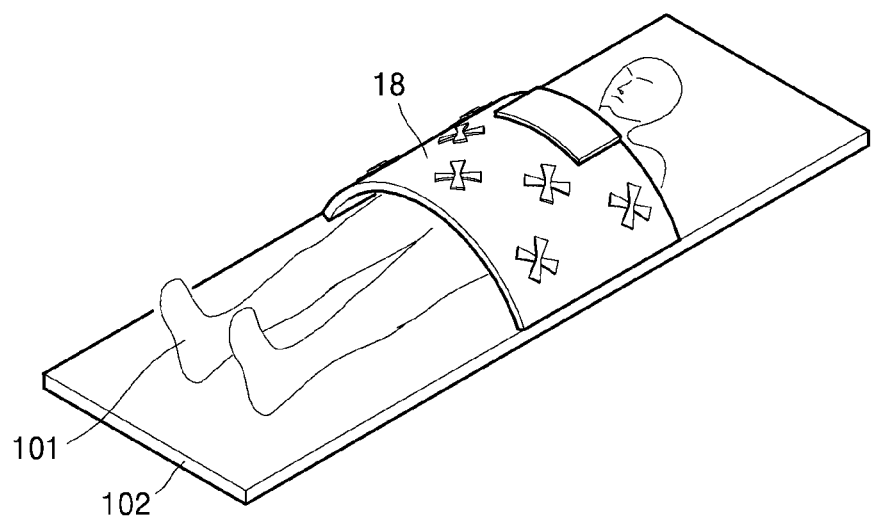
FIG. 6 is a diagram illustrating an example of the RF coil unit mounted on a bed.

FIG. 6 is a diagram illustrating an example of a structure of the RF coil unit of the MRI system mounted on a bed. Referring to FIGS. 1 to 6, in the MRI scanning system 110, the surface type RF coil unit 18 is provided on the bed 102 where the examinee 101 lies. Location of the surface type RF coil unit 18 may be randomly determined at a certain position on the bed 102 or in the bore 16. The surface type RF coil unit 18 may be movably mounted on the bed 102 or in the bore 16. Since the surface type RF coil unit 18 is mounted on the bed 102, the examinee 101 may be located inside the bore 16 to capture image information of the examinee 101, and the image information of a certain part of the examinee 101 may be obtained inside the bore 16.

The MRI scanning system 110 of the MRI system 100 may include the main magnet 10 and the RF coil unit 14 inside the gradient magnetic field coil 12 wherein the RF coil unit 14 includes the multiple RF coil elements having the conductive layers crossing each other. The MRI scanning system may also include the surface type RF coil unit 18 that is mounted on the bed 102 or inside the bore 16, and includes multiple RF coil elements. The RF coil elements that include two different conductive layers crossing each other provide a MRI system having a uniform magnetic field characteristic.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims

What is claimed is:

1. A magnetic resonance imaging (MRI) apparatus comprising:
   a magnet configured to generate a magnetic field;
   a magnetic field coil configured to generate a gradient magnetic field and the magnetic field coil is disposed inside the magnet; and
   a radio-frequency (RF) coil unit comprising RF coil elements and the RF coil unit is disposed inside the magnetic field coil,
   wherein the RF coil unit comprises RF coil elements disposed on an insulating structure and each RF coil element comprises:
      a first conductive layer laced in a first direction.
      a first dielectric layer mounted on the first conductive laver,
      a second conductive layer mounted on the first dielectric layer and placed in a Second direction, the second direction being different than the first direction, and
      a second dielectric layer disposed between the insulating structure and the first conductive laver.

2. The MRI apparatus of claim 1, wherein a width of the first conductive layer where the first and second conductive layers cross each other is narrower than other portions of the first conductive layer.

3. The MRI apparatus of claim 1, wherein a width of the second conductive layer where the first and second conductive layers cross each other is narrower than other portions of the second conductive layer.

4. The MRI apparatus of claim 1, wherein the insulating structure is composed of fiber reinforced plastics (FRP).

5. A magnetic resonance imaging (MRI) apparatus comprising:
   a surface type radio frequency (RF) coil unit that is located inside a bore of the MRI apparatus; and
   the surface type RF coil unit comprising RF coil elements disposed on an insulating structure and each RF coil element comprises;
      a first conductive layer placed in a first direction;
      a first dielectric layer mounted on the first conductive layer; and
      a second conductive layer mounted on the first dielectric layer and placed in a second direction, the second direction being different than the first direction and
      a second dielectric layer disposed between the insulating structure and the first conductive laver.

6. The MRI apparatus of claim 5, wherein a width of the first conductive layer where the first and second conductive layers cross each other is narrower than other portions of the first conductive layer.

7. The MRI apparatus of claim 5, wherein a width of the second conductive layer where the first and second conductive layers cross each other is narrower than other portions of the second conductive layer.

8. The MRI apparatus of claim 5, wherein the surface type RF coil unit is mounted on a bed.

9. An RF coil unit of a magnetic resonance imaging (MRI) apparatus comprising:
   an insulating structure; and
   RF coil elements disposed on the insulating structure and each RF coil element comprising
      a first conductive layer placed in a first direction,
      a first dielectric layer mounted on the first conductive layer,
      a second conductive layer mounted on the first dielectric layer and placed in a second direction, the second direction being different than the first direction, and
      a second dielectric layer disposed between the insulating structure and the first conductive layer.

10. The RF coil unit of claim 9, wherein:
    a width of the first conductive layer where the first and second conductive layers cross each other is narrower than other portions of the first conductive layer; and
    a width of the second conductive layer where the first and second conductive layers cross each other is narrower than other portions of the second conductive layer.

11. The RF coil unit of claim 9, further comprising a controller connected to each conductive layer of the RF coil elements.

12. The RF coil unit of claim 11, wherein the controller is connected to the conductive layers of the RF coil elements using cables, and the cables are configured to transmit signals between the RF coil elements and the controller.

* * * * *